United States Patent
Li

(10) Patent No.: US 9,115,298 B2
(45) Date of Patent: Aug. 25, 2015

(54) STRIPPABLE ADHESION COMPOSITION AND USES THEREOF

(71) Applicant: CHI MEI CORPORATION, Tainan (TW)

(72) Inventor: Kuang-Chieh Li, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 0 days.

(21) Appl. No.: 14/086,322

(22) Filed: Nov. 21, 2013

(65) Prior Publication Data

US 2014/0162060 A1    Jun. 12, 2014

(30) Foreign Application Priority Data

Dec. 6, 2012   (TW) .............................. 101145777 A

(51) Int. Cl.
| | | |
|---|---|---|
| C08L 25/04 | (2006.01) | |
| C09J 153/02 | (2006.01) | |
| C09J 147/00 | (2006.01) | |
| H05K 3/00 | (2006.01) | |

(52) U.S. Cl.
CPC .............. *C09J 147/00* (2013.01); *C09J 153/02* (2013.01); *C09J 153/025* (2013.01); *H05K 3/0076* (2013.01); *H05K 2203/044* (2013.01); *H05K 2203/1383* (2013.01); *Y10T 428/2874* (2015.01)

(58) Field of Classification Search
CPC ............ H05K 2203/1383; C09J 153/02; C09J 147/00; C09J 2203/326; C08L 53/02
See application file for complete search history.

(56) References Cited

U.S. PATENT DOCUMENTS

| | | | | |
|---|---|---|---|---|
| 3,380,863 A | * | 4/1968 | Silberberg ...................... 216/44 |
| 4,101,484 A | * | 7/1978 | Doss .............................. 524/271 |
| 4,158,557 A | * | 6/1979 | Drummond ...................... 65/382 |
| 5,430,104 A | * | 7/1995 | Siol et al. ......................... 525/231 |
| 6,114,261 A | * | 9/2000 | Strelow et al. .................. 442/153 |
| 2007/0218374 A1 | * | 9/2007 | Kitano et al. ..................... 430/14 |
| 2008/0161479 A1 | * | 7/2008 | Amino et al. .................. 524/526 |
| 2008/0200011 A1 | * | 8/2008 | Pillalamarri et al. ......... 438/458 |
| 2009/0117379 A1 | | 5/2009 | Toyoshima et al. |
| 2012/0277363 A1 | * | 11/2012 | Lin et al. ....................... 524/274 |

FOREIGN PATENT DOCUMENTS

| | | |
|---|---|---|
| CN | 101189317 A | 5/2008 |
| CN | 102757709 A | 10/2012 |
| TW | 201243005 | 11/2012 |

OTHER PUBLICATIONS

Eastman (Eastman's Spectrum of Hydrocarbon Resins. Eastman Chemical Co., Dec. 2004, 27 pages).*
Office Action issued on May 20, 2014 by Taiwan Patent Office for the counterpart TW Patent Application No. 101145777 cites TW201243005.
TW2012143005 corresponds to US2012277363.
Office action issued on Jul. 7, 2015 for the corresponding Chinese Patent Application No. 201310597433.5.
Search Report issued on Jul. 7, 2015 (with search report) for the corresponding Chinese Patent Application No. 201310597433.5.
English translation of the Search Report issued on Jul. 7, 2015 (with search report) for the corresponding Chinese Patent Application No. 201310597433.5.
CN 102757709 corresponds to US 2012277363.
CN 101189317 corresponds to US 2009117379.

* cited by examiner

*Primary Examiner* — Brieann R Fink
(74) *Attorney, Agent, or Firm* — WPAT, P.C.; Anthony King

(57) ABSTRACT

The invention relates to a strippable adhesion composition, and it has the advantage of good stripability. The invention also provides a strippable material and method for manufacturing the same and an electronic device and method for manufacturing the same.

20 Claims, No Drawings

STRIPPABLE ADHESION COMPOSITION AND USES THEREOF

BACKGROUND OF THE INVENTION

1. Field of the Invention

The invention relates to a resin. Particularly, the invention relates a strippable adhesion composition and uses thereof. When applying the strippable adhesion composition in soldering an electrical device on a printed circuit board or in spraying or plating a printed circuit board, the strippable adhesion composition can protect the surface can be mechanically strippable and removal after the procedure.

2. Description of the Related Art

Generally, the strippable adhesive composition for protecting the surface when soldering the electronic device on the printed circuit board commonly has the following two major purposes: (1) in the flow soldering process (by directly contacting the printed circuit board with the molten solder bath), the strippable adhesive composition mainly protects the parts where the flux or solder are not easily attached, such as the terminal, contact, or variable resistor; (2) in the reflow soldering process (by welding with the melting solder at a high temperature after temporarily fixing the electronic device), in order to protect the wire part or terminal from oxidation, the strippable adhesion composition avoids the impedance increasing and the pollution of the contact materials caused by oxidized or carbonized surface of the metal such as copper and gold, even at the high temperature of welding. Furthermore, after such operations, the strippable adhesion composition can be easily stripped with the mechanical equipments such as clamps.

To achieve the aforementioned purposes, the thermoplastic type of strippable adhesive composition mainly comprising polyvinylchloride and a plasticizer are now widely used in the field. In the manufacturing the strippable adhesive composition, the polyvinylchloride powder is dispersed in the plasticizer to form a paste, the paste is coated on the desired part through wire screen printing or brushing, and then heated at 100° C. to 150° C. for a few minutes to several tens of minutes, and the a film by fusing polyvinylchloride and the plasticizer is obtained.

Among the various thermoplastic resins, although polyvinylchloride has good heat resistance and is inexpensive, it is accompanied by dehydrochlorination and then decomposition when exposed to 240° C. to 270° C. for a long period of time. Such phenomenon not only causes resin discoloration, but also causes burning-out on the circuit board due to increased hardness and brittle and difficult stripping.

To solve these problems, an optimized additive plasticizer or stabilizer is generally used. However, even the stability of the polyvinylchloride film is improved in this way, the stripability is still poor after heat treatment. Therefore, the stripping must be performed immediately after welding to avoid poor stripability.

Therefore, overcoming the problem of poor stripability to meet the current requirements is the target in the field of the present invention.

SUMMARY OF THE INVENTION

In the present invention, the specific resin is provided to obtain a strippable adhesive composition with good stripability.

Therefore, the present invention provides a strippable adhesion composition comprising:

at least one block copolymer or hydrogenated copolymer thereof (A);
a styrene oligomer (B); and
a solvent (C);
wherein said block copolymer or hydrogenated copolymer thereof (A) comprises a frame, and the frame comprises at least two vinyl aromatic polymer blocks and at least one conjugated diene polymer block.

The present invention also provides a method for producing a strippable material comprising coating the strippable adhesion composition as mentioned above on a substrate.

The present invention also provides a strippable material, which is obtained by the method as mentioned above.

The present invention further provides an electronic device, comprising the strippable material as mentioned above.

The present invention further provides a method for producing an electronic device, comprising the method as mentioned above for providing a strippable material.

DETAILED DESCRIPTION OF THE INVENTION

The invention relates to a strippable adhesion composition comprising:

at least one block copolymer or hydrogenated copolymer thereof (A);
a styrene oligomer (B); and
a solvent (C);
wherein said block copolymer or hydrogenated copolymer thereof (A) comprises a frame, and the frame comprises at least two vinyl aromatic polymer blocks and at least one conjugated diene polymer block.

The frame of the block copolymer or hydrogenated copolymer thereof (A) according to the invention is preferably a vinyl aromatic polymer block-conjugated diene block-vinyl aromatic polymer block type. Examples of the vinyl aromatic monomer are styrene, α-methyl styrene, p-methyl styrene, divinylbenzene, 1,1-diphenylethylene, N,N-dimethyl-p-amino ethyl styrene and N,N-diethyl-p-amino ethyl styrene. More than one of the vinyl aromatic monomer is used; alternatively, more than two of the vinyl aromatic monomer can be used. In another aspect, the conjugated diene monomer is a diene comprising a pair of conjugated double bonds. Examples are 1,3-butadiene, 2-methyl-1,3-butadiene (isoprene), 2,3-dimethyl-1,3-butadiene, 1,3-pentadiene, 2-methyl-1,3-pentadiene and 1,3-hexadiene, and preferably are 1,3-butadiene and isoprene. More than one of the conjugated diene monomer is used; alternatively more than two of the conjugated diene monomer can be used.

In one preferred embodiment of the invention, the block copolymer is styrene-butadiene-styrene block copolymer (SBS), styrene-isoprene-styrene block copolymer (SIS), styrene-vinylisoprene-styrene block copolymer (SVIS), styrene-ethylene/butylene-styrene block copolymer (SEBS), styrene-ethylene/propylene-styrene block copolymer (SEPS), or styrene-butadiene-butylene-styrene block copolymer (SBBS).

The content of the vinyl aromatic polymer block according to the invention in the block copolymer or hydrogenated copolymer thereof (A) can be decided by artisans skilled in this field, and preferably is 20 mol % to 60 mol %. When the content of the vinyl aromatic polymer block in the block copolymer or hydrogenated copolymer thereof (A) is 20 mol % to 60 mol %, the stripability is satisfactory when applying the strippable adhesive composition on an electrical device such as glass, a semiconductor chip or a printed circuit board.

The contents of the residual vinyl aromatic monomer and the vinyl aromatic oligomer in the strippable adhesive composition according to the invention is adjusted to obtain good stripability.

In the strippable adhesive composition according to the invention, the content of an residual vinyl aromatic monomer is less than 600 ppm; preferably 10 ppm to 500 ppm; more preferably 10 ppm to 400 ppm. If the content of the residual vinyl aromatic monomer is less than 600 ppm in the strippable adhesive composition, the stripability is better.

The proper method for producing the block copolymer or hydrogenated copolymer thereof (A) can be decided by artisans skilled in this field according to the content of the residual vinyl aromatic monomer.

In one preferred embodiment of the invention, the content of the residual vinyl aromatic monomer is controlled through a proper synthesis. For example, an anionic polymerization method which uses the organic lithium initiator is applied. In one embodiment of the invention, a reaction system is provided. The reaction system comprises a Continuous stirred-tank reactor R1 which is preferably coupled to an agitator means to have a reflux flow. A raw material system can be fed continuously or batch-wise from one side of the reactor R1, and the product extracted from one side of the reactor R1 in the continuous polymerization. Preferably, a plurality of the reactors R1 or one reactor R1 and a plug flow reactor R2 are combined to carry out a complex polymerization. More preferably, the Continuous stirred-tank reactor R1 is connected to the plug flow reactor R2. The reflux flow makes the initiator have a larger residence time distribution and significantly improve the molecular weight distribution of the polymer. More preferably, the reaction system further comprises a Continuous stirred-tank reactor R3 coordinated with the plug flow reactor R2, which enables the monomers to be mixed completely and converted to the polymer more efficiently, thus improving molecular weight distribution. This method is helpful in converting the monomer to the polymer completely and reduces the content of the residual vinyl aromatic monomer in the strippable adhesive composition and enhances the low molecular weight ingredient to volatize after the desiccation of the resins.

In another aspect, the content of the residual vinyl aromatic monomer is reduced by controlling the feed rate. The polymerization rate of the monomer and the feed rate of the monomer are balanced to reduce the residual monomer content in the Continuous stirred-tank reactor.

In another aspect, the content of the residual vinyl aromatic monomer is reduced by controlling the content of the organic lithium initiator. The organic lithium according to the invention refers to an organic metallic compound having a carbon-lithium binding; preferably an alkyl or a phenyl and substitutes of lithium thereof. Ethyl lithium, n-propyl lithium, n-butyl lithium, sec-butyl lithium, tert-butyl lithium, and benzyl lithium are mentioned as a desirable example of the alkyl lithium. Preferably, the amount of the organic lithium used is 0.5 mmol to 200 mmol; more preferably 1 mmol to 100 mmol; still more preferably 2 mmol to 20 mmol per 1 kg of the monomer.

In one preferred embodiment of the invention, the vinyl aromatic monomer is contained in a solvent to enhance the reaction of the organic lithium initiator. Preferably, the solvent is a hydrocarbon solvent which can dissolve a monomer and a formed polymer, and maintain the liquid form in the process of polymerization, and can be easily removed by volatilization after the polymerization. For example, the solvent can be an alicyclic hydrocarbon solvent of C5-C9 or an aromatic solvent of C6-C9. The examples of the alicyclic hydrocarbon solvent of C5-C9 are cyclohexane, methylcyclohexane, methylcyclopentane, cyclohexenes, and the mixture thereof. The examples of the aromatic solvent of C6-C9 are benzene, toluene, ethylbenzene, xylene, naphthalene, and the mixture thereof. The ratio of the solvent and the monomer is preferably 0.1 to 3 kg of the solvent; more preferably 0.5 to 2.0 kg; still more preferably 0.67 to 1.5 kg per kg of the monomer.

In still another aspect, the content of the residual vinyl aromatic monomer relates to the temperature of the polymerization. If the temperature of the polymerization is too low, the reaction rate is reduced and the production efficiency is poor. On the other hand, if the temperature of the polymerization is too high, residual vinyl aromatic monomer and vinyl aromatic oligomer content increases, and the reaction rate is reduced with the decrease of the initiator. Preferably, the temperature of the polymerization is 40° C. to 120° C.; more preferably, 60° C. to 110° C.; still more preferably, 70° C. to 90° C.

The block copolymer or hydrogenated copolymer thereof (A) according to the invention can be produced by a publicly known method. For example, a batch wise or continuous polymerization in the hydrocarbon solvent and the organic lithium initiator is carried out to obtain the block copolymer comprising the vinyl aromatic polymer block and the conjugated diene polymer block. After copolymerization, the copolymer comprising the vinyl aromatic polymer block and the conjugated diene polymer block can be further produced by coupling the lithium activity end of the copolymer. The concrete manufacturing method is described in Japanese Patent Nos. 1970-19388 and 1972-43618. Such documents are incorporated as references.

In one preferred embodiment of the invention, the polymerization is carried out in a solvent. The kinds and the amount of the solvent of the polymerization can be those of the monomer as mentioned above.

In one preferred embodiment of the invention, the temperature of the polymerization can be that of the vinyl aromatic monomer.

In one another preferred embodiment of the invention, the content of the residual vinyl aromatic monomer is reduced by purifying the block copolymer or hydrogenated copolymer thereof (A). For example, several repetitions of the volatilization removal of the block copolymer or hydrogenated copolymer thereof (A) is preferred. Particularly, the unreacted monomer and/or oligomer or solvent are volatilized and removed and recycled. A publicly known method can be used for the volatilization removal, such as a volatilization removal equipment. In one preferred embodiment of the invention, the volatilization removal is conducted by a flash treatment in a vacuum tank and by removal through a vent-port of an extrusion machine. In one preferred embodiment of the invention, the volatilization removal of the solvent or the residual vinyl aromatic monomer and vinyl aromatic oligomer is conducted at the temperature of 150° C. to 300° C.; preferably 180° C. to 260; and at the pressure of 0 to the normal pressure; preferably 100 Pa to 50 KPa. In one preferred embodiment of the invention, a plurality of volatilization removal equipment in parallel or in series is applied in order to remove the residual vinyl aromatic monomer more effectively. More preferably, water is added between the first step and the second step of volatilization removal to enhance the effectiveness of the second volatilization.

In another aspect, in one preferred embodiment of the invention, when the number average molecular weight of the block copolymer or hydrogenated copolymer thereof (A) is from 50,000 to 100,000, the strippable adhesive composition with good stripability is obtained.

Examples of the styrene oligomer (B) according to the invention are low-molecular-weighted styrene oligomer, low-molecular-weighted styrene-α-methyl styrene oligomer, low-molecular-weighted α-methyl styrene oligomer, low-molecular-weighted α-methyl styrene and vinyltoluene oligomer, low-molecular-weighted α-pinene oligomer, low-molecular-weighted β-pinene oligomer, and low-molecular-weighted d-limonene oligomer.

Examples of the low-molecular-weighted styrene oligomer according to the invention are Himer SB-75 (average molecular weight of 2000) and Himer ST-95 (average molecular weight of 4000) manufactured by Sanyo Kasei Kogyo Co., Ltd.

Examples of the low-molecular-weighted styrene-α-methyl styrene oligomer are Picolastic A5 (average molecular weight of 317) and Picolastic A75 (average molecular weight of 917) manufactured by Rika Hercules Inc.

Examples of the low-molecular-weighted α-methyl styrene oligomer are Christa Rex 3085 (average molecular weight of 664), Christa Rex 3100 (average molecular weight of 1020), and Christa Rex 1120 (average molecular weight of 2420) manufactured by Rika Hercules Inc.

Examples of the low-molecular-weighted α-methyl styrene and vinyltoluene oligomer are Picotex LC (average molecular weight of 950) and Picotex 100 (average molecular weight of 1740) manufactured by Rika Hercules Inc.

Examples of the low-molecular-weighted α-pinene oligomer are Picolite A115 (average molecular weight of 833) manufactured by Rika Hercules Inc.

Examples of the low-molecular-weighted β-pinene oligomer are Picolite S115 (average molecular weight of 1710) manufactured by Rika Hercules Inc.

Examples of the low-molecular-weighted d-limonene oligomer are Picolite C115 (average molecular weight of 902) manufactured by Rika Hercules Inc.

The aforesaid styrene oligomer (B) can be used alone, or in combination of two or more. If the styrene oligomer (B) is not used, it leads the poor stripability.

In another aspect, in one preferred embodiment of the invention, the average molecular weight of the styrene oligomer (B) is from 300 to 3,500 to obtain the strippable adhesive composition with good stripability. More preferably, the average molecular weight of the styrene oligomer (B) is from 300 to 3,000; still more preferably, the average molecular weight of the styrene oligomer (B) is from 300 to 2,500.

Preferably, the amount of the styrene oligomer (B) used is from 5 to 50 parts based on 100 parts by weight of the at least one block copolymer or hydrogenated copolymer thereof (A) used; more preferably from 8 to 45 parts; still more preferably from 10 to 40 parts. When the amount of the styrene oligomer (B) used is from 5 to 50 parts, the strippable adhesive composition has the better stripability.

The strippable adhesive composition according to the invention comprises the solvent (C). The choice of solvent (C) depends on the condition of drying the strippable adhesive composition at room temperature. Preferably, the solvent (C) is a ketone solvent such as acetone and methyl ethyl ketone; an aromatic solvent such as toluene and xylene; an aliphatic solvent such as cyclohexane, methylcyclohexane and ethylcyclohexane; an ester solvent such as ethyl acetate, butyl acetate, and isopropyl acetate; an alcohol solvent such as ethanol and butanol; a petroleum solvent such as paraffin oil, naphthene oil, mineral turpentine, naphtha, and other petroleum based solvents. In another aspect, the melting point of the solvent (C) is preferably 70° C. to 140° C. When the melting point of the solvent (C) is preferably 70° C. to 140° C., the strippable adhesive composition according to the invention avoids the problem of being not fully dried.

Preferably, the amount of the solvent (C) used is from 50 to 1,000 parts based on 100 parts by weight of the at least one block copolymer or hydrogenated copolymer thereof (A) used; more preferably from 75 to 900 parts; still more preferably from 100 to 800 parts. When the amount of the solvent (C) used is from 50 to 1,000 parts, the strippable adhesive composition has the better coating functionality.

The strippable adhesive composition according to the invention preferably further comprises an antistatic agent (D). When the antistatic agent (D) is comprised, the strippable adhesion composition according to the invention has the better surface resistivity.

According to the invention, the antistatic agent (D) comprises a cationic antistatic agent (D1), an anionic antistatic agent (D2) or a non-ionic antistatic agent (D3).

According to the present invention, the cationic antistatic agent (D1) is exampled as the following: amidine salt, guanidine salt and quaternary ammonium salt and the like; wherein the anions constituting the salt are weak acid, strong acid and superacid conjugate base. From the antistatic point of view, the cationic antistatic agent (D1) is preferably superacid conjugate base amidinate and guanidinate.

According to the present invention, the anionic antistatic agent (D2) is exampled as the following: sulfonate (C10 or higher and Mn 1, 000 or less, such as sodium lauryl sulfonate, polyvinyl sulfonate), sulfate (C10 to 25, such as lauryl sulfate, EO 3 mol adduct of lauryl sulfate) phosphate (C10 to 25, such as octyl phosphate, EO 3 molar adduct of lauryl phosphate) and the like; wherein the cation constituting the salt are alkali metal (such as Na, K) ions. From the antistatic point of view, the anionic antistatic agent (D2) is preferably sulfonate.

According to the present invention, the non-ionic antistatic agent (D3) is exampled as the following: EO adduct of higher alcohols (C8 to 24, such as oleyl alcohol, lauryl alcohol and stearyl alcohol), PEG fatty acid esters, fatty acid ester of polyhydric (bi to tri or more) alcohol (GR, PE, sorbitol (hereinafter referred to as SO), and sorbitol). From the antistatic point of view, the non-ionic antistatic agent (D3) is preferably fatty acid ester of polyhydric alcohol.

Example of the cationic antistatic agent according to the invention is Tetronic TR701 manufactured by Adeka Corporation.

Example of the non-ionic antistatic agent according to the invention is PEG #400 manufactured by Toho Kagaku.

The strippable adhesive composition according to the invention preferably further comprises an additive (E), such as a filler, a modifier, a defoaming agent, a colorant, or an adhesive agent. Examples of the filler are silicon oxide, magnesium oxide, aluminum hydroxide, aluminum oxide, aluminium nitride, boron nitride, and calcium carbonate, and preferably the filler is powder. Examples of the modifier are manganese naphthenate and the like and metal salts such as manganese octenate. Examples of the defoaming agent are silicone oil, fluorine oil, and polycarboxylic acid polymers. Examples of the colorant are inorganic pigments, organic pigments, organic dyes and the like. Examples of the organic pigments are C. I. Pigment B1, 2, 15, 15:3, 15:4, 15:6, 16, 22, 60, 66; C. I. Pigment C1, 7.

In one preferred embodiment of the invention, a method for producing the strippable adhesive composition according to the invention comprises dispersing the aforementioned block copolymer or hydrogenated copolymer thereof (A), styrene oligomer (B), antistastic agent (D), and additives (E) in the solvent (C), and stirring for 3 to 24 hours in a mixer to dissolve the solids to form the strippable adhesive composition. In general, the viscosity of the strippable adhesive composition can be adjusted by artisans skilled in this field according to the coating, volatility and other properties. When the viscosity of the strippable adhesive composition is 0.1 to 30 Pa·S, the strippable adhesive composition has a better coating property; preferably, the viscosity is 0.1 to 20 Pa·S; more preferably, 0.1 to 10 Pa·S.

The present invention also provides a method for producing a strippable material comprising coating the strippable adhesion composition as mentioned above on a substrate. Preferably, the substrate is an electronic component.

According to the invention, the electronic component suitable for the treatment with the strippable adhesive composition includes but is not limited to a circuit board equipped with microprocessors, transistors, capacitors, resistors, relays, or transformers, wherein the circuit board has patterns of lead wires or wire harness in need of the treatment.

According to the present invention, the treatment of the electronic component with the strippable adhesive composition can be a known coating procedure, such as dipping, brush coating, spray coating, and dispenser coating. In one preferred embodiment of the invention, the electronic component is further dried at 20 to 80° C. after coating to obtain the electronic device according to the invention.

The present invention also provides a strippable material, which is obtained by the method as mentioned above.

The present invention further provides an electronic device, comprising the strippable material as mentioned above.

The present invention further provides a method for producing an electronic device, comprising the method as mentioned above for providing a strippable material.

The following examples are given for the purpose of illustration only and are not intended to limit the scope of the present invention.

EXAMPLE

Block Copolymer or Hydrogenated Copolymer Thereof (A)

The block copolymer or hydrogenated copolymer thereof (A) is prepared in the solvent of cyclohexane and with the catalyst of n-butyl lithium to obtain the block copolymer or hydrogenated copolymer thereof (A) having the block copolymer structure, styrene content (weight %), number average molecular weight and the content of the residual vinyl aromatic monomer as shown in Table 1. The specific method is described below.

Synthesis Example A-1

The reactors as shown below are combined in order: a 1-L continuous stirred-tank reactor R1 coupled to an agitator means, a 2-L plug flow reactor R2 coupled to an agitator means, and a 1-L continuous stirred-tank reactor R3 coupled to an agitator means. The temperature of the three reactors is 80° C. The mixture solution of the styrene monomer and the solvent cyclohexane with weight ratio of 30/70 is fed with a feed rate of 0.25 kg/hr into the reactor R1.

Then, a cyclohexane solution containing the n-butyl lithium initiator is added in the same reactor for the reaction. The amount of the butyl lithium initiator used is 14.0 mmole based on use of 1 kg of the final monomers.

The obtained polymer solution is fed into the reactor R2, and the mixture solution of the 1,3-butadiene monomer and the solvent cyclohexane with weight ratio of 30/70 is fed with a feed rate of 0.75 kg/hr to obtain the block copolymer of styrene-1,3-butadiene (S-B Block Copolymer).

The obtained polymer solution is fed into the reactor R3, and the new mixture solution of the styrene monomer and the solvent cyclohexane with weight ratio of 30/70 is fed with a feed rate of 0.25 kg/hr to obtain the block copolymer of styrene-1,3-butadiene-styrene (S-B-S Block Copolymer).

Methanol of a quantity 10 times the molar amount of the initiator is added to the obtained polymer solution. The solution is further volatilized by the method (a) (heat treatment of 150° C. in a convection oven for removing the solvent) and then the method (b) (heat treatment of 220° C. in a flash vacuum tank for removing the solvent).

Synthesis Example A-2

The reactors as shown below are combined in order: a 1-L continuous stirred-tank reactor R1 coupled to an agitator means, a 2-L plug flow reactor R2 coupled to an agitator means, and a 1-L continuous stirred-tank reactor R3 coupled to an agitator means. The temperature of the three reactors is 80° C. The mixture solution of the styrene monomer and the solvent cyclohexane with weight ratio of 30/70 is fed with a feed rate of 0.30 kg/hr into the reactor R1.

Then, a cyclohexane solution containing the n-butyl lithium initiator is added in the same reactor for the reaction. The amount of the butyl lithium initiator used is 14.0 mmole based on the use of 1 kg of the final monomers.

The obtained polymer solution is fed into the reactor R2, and the mixture solution of the 1,3-butadiene monomer and the solvent cyclohexane with weight ratio of 30/70 is fed with a feed rate of 0.60 kg/hr. The obtained polymer solution is fed into the reactor R3, and the new mixture solution of the styrene monomer and the solvent cyclohexane with weight ratio of 30/70 is fed with a feed rate of 0.30 kg/hr.

Methanol of a quantity 10 times the molar amount of the initiator is added to the obtained polymer solution. The solution is further volatilized by the method (b) (heat treatment of 220° C. in a flash vacuum tank for removing the solvent) and then the method (c) (heat treatment of 250° C. in an extruder with an additional vacuum relief vent for removing the solvent).

Synthesis Example A-3

The reactors as shown below are combined in order: a 1-L continuous stirred-tank reactor R1 coupled to an agitator means, a 2-L plug flow reactor R2 coupled to an agitator means, and a 1-L continuous stirred-tank reactor R3 coupled to an agitator means. The temperature of the three reactors is 80° C. The mixture solution of the styrene monomer and the solvent cyclohexane with weight ratio of 30/70 is fed with a feed rate of 0.36 kg/hr into the reactor R1.

Then, a cyclohexane solution containing the n-butyl lithium initiator is added in the same reactor for the reaction. The amount of the butyl lithium initiator used is 14.0 mmole based on the use of 1 kg of the final monomers.

The obtained polymer solution is fed into the reactor R2, and the mixture solution of the 1,3-butadiene monomer and the solvent cyclohexane with weight ratio of 30/70 is fed with a feed rate of 0.48 kg/hr. The obtained polymer solution is fed into the reactor R3, and the new mixture solution of the styrene monomer and the solvent cyclohexane with weight ratio of 30/70 is fed with a feed rate of 0.36 kg/hr.

Methanol of a quantity 10 times the molar amount of the initiator is added to the obtained polymer solution. The solution is further volatilized by the method (a) (heat treatment of 150° C. in a convection oven for removing the solvent) and then the method (b) (heat treatment of 220° C. in a flash vacuum tank for removing the solvent) and further the method (c) (heat treatment of 250° C. in an extruder with an additional vacuum relief vent for removing the solvent).

Synthesis Example A-4

The reactors as shown below are combined in order: a 1-L continuous stirred-tank reactor R1 coupled to an agitator means, a 2-L plug flow reactor R2 coupled to an agitator means, and a 1-L continuous stirred-tank reactor R3 coupled to an agitator means. The temperature of the three reactors is 80° C. The mixture solution of the styrene monomer and the solvent cyclohexane with weight ratio of 30/70 is fed with a feed rate of 0.42 kg/hr into the reactor R1.

Then, a cyclohexane solution containing the n-butyl lithium initiator is added in the same reactor for the reaction. The amount of the butyl lithium initiator used is 14.0 mmole based on the use of 1 kg of the final monomers.

The obtained polymer solution is fed into the reactor R2, and the mixture solution of the 1,3-butadiene monomer and the solvent cyclohexane with weight ratio of 30/70 is fed with a feed rate of 0.36 kg/hr. The obtained polymer solution is fed into the reactor R3, and the new mixture solution of the styrene monomer and the solvent cyclohexane with weight ratio of 30/70 is fed with a feed rate of 0.42 kg/hr.

Methanol of a quantity 10 times the molar amount of the initiator is added to the obtained polymer solution. The solution is further volatilized by the method (a) (heat treatment of 150° C. in a convection oven for removing the solvent).

Synthesis Example A-5

The reactors as shown below are combined in order: a 1-L continuous stirred-tank reactor R1 coupled to an agitator means, a 2-L plug flow reactor R2 coupled to an agitator means. The temperature of the four reactors is 80° C. The mixture solution of the styrene monomer and the solvent cyclohexane with weight ratio of 30/70 is fed with a feed rate of 0.90 kg/hr into the reactor R1.

Then, a cyclohexane solution containing the n-butyl lithium initiator is added in the same reactor for the reaction. The amount of the butyl lithium initiator used is 14.0 mmole based on the use of 1 kg of the final monomers.

The obtained polymer solution is fed into the reactor R2, and the mixture solution of the 1,3-butadiene monomer and the solvent cyclohexane with weight ratio of 30/70 is fed with a feed rate of 0.60 kg/hr. After completing the reaction, methanol of a quantity 10 times the molar amount of the initiator is added to the obtained polymer solution. The solution is further volatilized by the method (a) (heat treatment of 150° C. in a convection oven for removing the solvent) and then the method (b) (heat treatment of 220° C. in a flash vacuum tank for removing the solvent) and further the method (c) (heat treatment of 250° C. in an extruder with an additional vacuum relief vent for removing the solvent).

The content of the residual vinyl aromatic monomer of the obtained block copolymers or hydrogenated copolymers thereof A-1 to A-5 are assayed with gas chromatography. The results are shown in Table 1.

TABLE 1

Synthesis examples of the block copolymer or hydrogenated copolymer thereof (A)

| | Content of styrene polymer (wt %) | Structure of block copolymer ( ) representing the weight ratio (wt %) | Feed rate (kg/hr) Reactor | | | | Volatilization method | Number average molecule weight (Mn) | Content of residual vinyl aromatic monomer (ppm) |
|---|---|---|---|---|---|---|---|---|---|
| | | | R1 | R2 | R3 | R4 | | | |
| A-1 | 40 | S-B-S (20-60-20) | 0.25 | 0.75 | 0.25 | The reaction goes on without feeding. | (A) + (B) | 65136 | 180 |
| A-2 | 50 | S-B-S (25-50-25) | 0.30 | 0.60 | 0.30 | The reaction goes on without feeding. | (B) + (C) | 73347 | 550 |
| A-3 | 60 | S-B-S (30-40-30) | 0.36 | 0.48 | 0.36 | The reaction goes on without feeding. | (A) + (B) + (C) | 89325 | 68 |
| A-4 | 70 | S-B-S (35-30-35) | 0.42 | 0.36 | 0.42 | The reaction goes on without feeding. | (A) | 98542 | 2121 |
| A-5 | 60 | S-B (60-40) | 0.90 | 0.60 | — | — | (A) + (B) + (C) | 73513 | 209 |

(A) heat treatment of 150° C. in a convection oven for removing the solvent
(B) heat treatment of 220° C. in a flash vacuum tank for removing the solvent
(C) heat treatment of 250° C. in an extruder with an additional vacuum relief vent for removing the solvent Strippable Adhesive Composition Example 1

100 parts by weight of the aforementioned block copolymer or hydrogenated copolymer thereof (A-1), 5 parts by weight of the styrene oligomer (B-1) shown in Table 2 are added in 50 parts by weight of the solvent (C-1), and stirring is performed for 16 hours in a mixer to dissolve the solids to form the strippable adhesive composition. The strippable adhesive composition is assayed according to the methods described below, and the results are shown in Table 2.

Examples 2 to 8

The preparations are similar to that of Example 1 with modifications of the kinds and amounts of the block copolymer or hydrogenated copolymer thereof (A), styrene oligomer (B), antistastic agent (D), and additives (E) in the solvent (C). The compositions and the results of the assays are shown in Table 2.

Comparative Examples 1 to 4

The preparations are similar to that of Example 1 with modifications of the kinds and amounts of the block copolymer or hydrogenated copolymer thereof (A), styrene oligomer (B), antistastic agent (D), and additives (E) in the solvent (C). The compositions and the results of the assays are shown in Table 2.

○: the film is pulled up completely without breakage and no residues remain on the substrate Δ: the film is pulled up completely without breakage and small amounts of residues remain on the substrate X: the film is pulled up completely without breakage and large amounts of residues remain on the substrate Surface Resistivity The cured film is subjected to the humidity treatment at 23° C., 50% RH for 24 hours and then assayed with the ultra-insulation meter according to ASTM D257.

◎: Surface resistivity value≤$1\times10^{13}\Omega$

○: $1\times10^{13}\Omega$<Surface resistivity value

TABLE 2

Examples of the strippable adhesive composition

| Content | | Examples | | | | | | | |
|---|---|---|---|---|---|---|---|---|---|
| | | 1 | 2 | 3 | 4 | 5 | 6 | 7 | 8 |
| Block copolymer (A) | A-1 | 100 | | | | 100 | | | 50 |
| (parts by weight) | A-2 | | 100 | | | | 100 | 100 | 50 |
| | A-3 | | | 100 | | | | | |
| | A-4 | | | | 100 | | | | |
| | A-5 | | | | | | | | |
| Styrene oligomer (B) | B-1 | 5 | | | 50 | 10 | | | 30 |
| (parts by weight) | B-2 | | 20 | | | 10 | 20 | | |
| | B-3 | | | 35 | | | | | |
| | B-4 | | | | | | | 20 | |
| Solvent (C) | C-1 | 50 | | | 200 | 200 | | | |
| (parts by weight) | C-2 | | 400 | | | | 50 | 400 | 500 |
| | C-3 | | | 600 | | | | | 500 |
| Antistastic agent (D) | D-1 | | 2 | | | | | | |
| (parts by weight) | D-2 | | | | | | 15 | | |
| additives (E) | E-1 | | | 1 | | | | | |
| (parts by weight) | E-2 | | | | | 2 | | | |
| Content of the residual vinyl aromatic monomer (ppm) | | 116 | 105 | 9 | 606 | 56 | 297 | 100 | 20 |
| Results of assay | Stripability | ○ | ○ | ○ | Δ | ○ | ○ | Δ | ○ |
| | Surface resistivity | ○ | ◎ | ○ | ○ | ○ | ◎ | ○ | ○ |

B-1: Picolastic A5 (average molecular weight of 317) manufactured by Rika Hercules Inc.
B-2: Christa Rex 3085 (average molecular weight of 664) manufactured by Rika Hercules Inc
B-3: Himer SB-75 (average molecular weight of 2000) manufactured by Sanyo Kasei Kogyo Co., Ltd
B-4: Himer ST-95 (average molecular weight of 4000) manufactured by Sanyo Kasei Kogyo Co., Ltd
C-1: cyclohexane
C-2: methyl cyclohexane
C-3: ethyl cyclohexane
D-1: Tetronic TR701 manufactured by Adeka Corporation.
D-2: PEG # 400 manufactured by Toho Kagaku
E-1: C.I. Pigment B15:6
E-2: C.I. Pigment C07

Assays

Assay of the Contents of the Residual Monomer and Oligomer

The strippable adhesive composition is dissolved in chloroform and assayed with gas chromatography with the flame ionization detector (No. 6890, produced by Agilent Technologies; column: HP-5). The unit is ppm.

Stripability

The strippable adhesive composition is coated on a 100 mm×100 mm of rectangular glass substrate to form an 80 mm×80 mm of coating film with a blade coater (ZAA-2300 manufactured by Chuan Hua Corporation).

The coating film is heated for removing (drying) the volatile component to form a hardened film. The heating condition is using a hot plate at 120° C. for 20 minutes.

When the heating process is completed, the coating film is quickly pulled up along the direction perpendicular to the substrate at a rate of 10 cm/s. The criteria of the assay are shown blow:

TABLE 3

Comparative examples of the strippable adhesive composition

| Content | | Comparative Example | | | |
|---|---|---|---|---|---|
| | | 1 | 2 | 3 | 4 |
| Block copolymer (A) (parts by weight) | A-1 | | 100 | | |
| | A-2 | | | | |
| | A-3 | | | | |
| | A-4 | | | | 100 |
| | A-5 | 100 | | 100 | |
| Styrene oligomer (B) (parts by weight) | B-1 | 20 | | | |
| | B-2 | | | | |
| | B-3 | | | | |
| | B-4 | | | | |
| Solvent (C) (parts by weight) | C-1 | 400 | | | 200 |
| | C-2 | | 400 | | |
| | C-3 | | | 400 | |

TABLE 3-continued

Comparative examples of the strippable adhesive composition

| | | Comparative Example | | | |
|---|---|---|---|---|---|
| Content | | 1 | 2 | 3 | 4 |
| Antistatic agent (D) (parts by weight) additives (E) (parts by weight) | D-1 D-2 E-1 E-2 | | | | |
| Content of the residual vinyl aromatic monomer (ppm) | | 40 | 36 | 42 | 707 |
| Results of assay | Stripability | x | x | x | x |
| | Surface resistivity | ○ | ○ | ○ | ○ |

B-1: Picolastic A5 (average molecular weight of 317)manufactured by Rika Hercules Inc.
B-2: Christa Rex 3085 (average molecular weight of 664) manufactured by Rika Hercules Inc
B-3: Himer SB-75 (average molecular weight of 2000) manufactured by Sanyo Kasei Kogyo Co., Ltd
B-4: Himer ST-95 (average molecular weight of 4000) manufactured by Sanyo Kasei Kogyo Co., Ltd
C-1: cyclohexane
C-2: methyl cyclohexane
C-3: ethyl cyclohexane
D-1: Tetronic TR701 manufactured by Adeka Corporation.
D-2: PEG # 400 manufactured by Toho Kagaku
E-1: C.I. Pigment B15:6
E-2: C.I. Pigment C07

As shown in Tables 2 and 3, the stripability of the Examples are better than those of the Comparative Examples. The strippable adhesive composition according to the invention has good stripability.

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:

1. A strippable adhesion composition comprising:
   at least one block copolymer or hydrogenated copolymer thereof (A);
   a styrene oligomer (B); and
   a solvent (C);
   wherein said block copolymer or hydrogenated copolymer thereof (A) comprises a frame, and the frame comprises at least two vinyl aromatic polymer blocks and at least one conjugated diene polymer block;
   wherein the content of residual vinyl aromatic monomer is less than 600 ppm;
   wherein the strippable adhesion composition further comprises an antistatic agent (D), with the antistatic agent (D) comprising a cationic antistatic agent (D1) or an anionic antistatic agent (D2).

2. The strippable adhesion composition according to claim 1, wherein in the strippable adhesion composition, the content of residual vinyl aromatic monomer is from 10 ppm to 500 ppm.

3. The strippable adhesion composition according to claim 2, wherein in the strippable adhesion composition, the content of residual vinyl aromatic monomer is from 10 ppm to 400 ppm.

4. The strippable adhesion composition according to claim 1, wherein the number average molecular weight of the styrene oligomer (B) is from 300 to 3,500.

5. The strippable adhesion composition according to claim 4, wherein the number average molecular weight of the styrene oligomer (B) is from 300 to 3,000.

6. The strippable adhesion composition according to claim 5, wherein the number average molecular weight of the styrene oligomer (B) is from 300 to 2,000.

7. The strippable adhesion composition according to claim 1, wherein the amount of the styrene oligomer (B) used is from 5 to 50 parts, and the amount of the solvent (C) used is from 50 to 1000 parts by weight based on 100 parts by weight of the at least one block copolymer or hydrogenated copolymer thereof (A) used.

8. The strippable adhesion composition according to claim 1, wherein the amount of the antistatic agent (D) used is from 1 to 20 parts based on 100 parts by weight of the at least one block copolymer or hydrogenated copolymer thereof (A) used.

9. A method for producing a strippable material comprising coating the strippable adhesion composition according to claim 1 on a substrate.

10. The method according to claim 9, wherein in the strippable adhesion composition, the content of residual vinyl aromatic monomer is from 10 ppm to 500 ppm.

11. The method according to claim 10, wherein in the strippable adhesion composition, the content of residual vinyl aromatic monomer is from 10 ppm to 400 ppm.

12. The method according to claim 9, wherein the number average molecular weight of the styrene oligomer (B) is from 300 to 3,500.

13. The method according to claim 12, wherein the number average molecular weight of the styrene oligomer (B) is from 300 to 3,000.

14. The method according to claim 13, wherein the number average molecular weight of the styrene oligomer (B) is from 300 to 2,000.

15. The method according to claim 9, wherein the amount of the styrene oligomer (B) used is from 5 to 50 parts, and the amount of the solvent (C) used is from 50 to 1000 parts by weight based on 100 parts by weight of the at least one block copolymer or hydrogenated copolymer thereof (A) used.

16. The method according to claim 9, wherein the amount of the antistatic agent (D) used is from 1 to 20 parts based on 100 parts by weight of the at least one block copolymer or hydrogenated copolymer thereof (A) used.

17. The method according to claim 9, wherein the substrate is an electronic component.

18. A strippable material, which is obtained by the method according to claim 9.

19. An electronic device, comprising the strippable material according to claim 18.

20. A method for producing an electronic device, comprising the method according to claim 9 for providing a strippable material.

* * * * *